(12) United States Patent
Maemoto

(10) Patent No.: US 6,258,510 B1
(45) Date of Patent: Jul. 10, 2001

(54) PHOTOSENSITIVE PLANOGRAPHIC PRINTING PLATE PRECURSOR

(75) Inventor: Kazuo Maemoto, Shizuoka-ken (JP)

(73) Assignee: Fuji Photo Film Co., Ltd., Minami-Ashigara (JP)

(*) Notice: Subject to any disclaimer, the term of this patent is extended or adjusted under 35 U.S.C. 154(b) by 0 days.

(21) Appl. No.: 09/315,429

(22) Filed: May 20, 1999

(30) Foreign Application Priority Data

May 21, 1998 (JP) .................................................. 10-139624

(51) Int. Cl.$^7$ ............................. G03C 1/77; G03C 1/675; G03F 7/029; G03F 7/031; G03F 7/032
(52) U.S. Cl. ................... 430/278.1; 430/302; 430/287.1; 430/281.1; 430/286.1; 430/914; 430/920
(58) Field of Search .......................... 430/278.1, 287.1, 430/281.1, 286.1, 302, 916, 914, 920, 925, 283.1

(56) References Cited

U.S. PATENT DOCUMENTS

| | | | |
|---|---|---|---|
| 4,619,998 | * 10/1986 | Buhr | 544/193.1 |
| 5,171,655 | * 12/1992 | Aoshima | 430/138 |
| 5,344,744 | * 9/1994 | Ueda et al. | 430/287.1 |
| 5,837,748 | * 11/1998 | Sorori | 522/26 |

FOREIGN PATENT DOCUMENTS

| | | |
|---|---|---|
| 47-8657 | 5/1972 | (JP) . |
| 3-129352 | * 6/1991 | (JP) . |
| WO96/34316 | 10/1996 | (WO) . |

OTHER PUBLICATIONS

Chemical Abstract 1992: 72347, File HCAPLUS of STN Database Service, Chemical Abstracts, American Chemical Society, 1991, p. 3–5 (English Abstract of JP 3–129352).*

* cited by examiner

*Primary Examiner*—Janet Baxter
*Assistant Examiner*—Sin J. Lee
(74) *Attorney, Agent, or Firm*—Burns, Doane, Swecker & Mathis, LLP

(57) ABSTRACT

A photosensitive planographic printing plate precursor comprising an aluminum substrate surface treated such that the center line surface roughness thereof (Ra) is in a range of from 0.30 μm or more to 0.55 μm or less and a photosensitive layer provided on the substrate and comprised of a photosensitive composition containing (a) a water-soluble or water-dispersible polymer, (b) a monomer or oligomer having at least one ethylenically unsaturated double bond capable of photopolymerization, and (c) a photopolymerization initiation system having $\lambda_{max}$ in a range of from 330 nm or more to 375 nm or less such that the light absorbance A at $\lambda_{max}$ and the absorbance B at 400 nm fulfill a relationship of B/A<0.1. A preferred example of (a) the water-soluble polymer is a polymer containing a sulfonic acid (salt) group.

20 Claims, No Drawings

PHOTOSENSITIVE PLANOGRAPHIC PRINTING PLATE PRECURSOR

BACKGROUND OF THE INVENTION

1. Field of the Invention

The present invention relates to a photosensitive planographic printing plate precursor that can be loaded immediately after exposure into a printing machine so that printing is started without any special processing such as development.

2. Description of the Related Art

According to prior art, in order to obtain prints by using a photosensitive planographic printing plate precursor (hereinafter referred to as a printing plate precursor on occasion), it is necessary to carry out a procedure that comprises exposing the printing plate precursor image-wise and developing the exposed plate with an appropriate developer so that a planographic printing plate precursor having a lipophilic image portion and a hydrophilic non-image portion is produced. After that, agum coating is applied in order to protect the planographic printing plate precursor. Following such wet processing, the planographic printing plate precursor is loaded into a printing machine and printing is started.

For developing processing as a processing step after exposure, a developer, which is an alkaline liquid or an alkaline liquid containing an organic solvent, is generally used. In this regard, because of environmental problems due to waste liquids of the developer or maintenance problems of automated developing machines, there is a demand for a system that requires no developing step.

In order to solve these problems, Japanese Patent Application National Publication (Laid-Open) No. 6-502,931 proposes a photosensitive planographic printing plate precursor having a double-layered photosensitive layer comprising a photosensitive hydrophilic layer and a photosensitive hydrophobic layer provided thereon. This photosensitive planographic printing plate precursor can be loaded immediately after exposure into a printing machine so that printing is started without any processing after exposure. This photosensitive planographic printing plate precursor, however, has a durability problem in printing because the adhesion between the upper layer and the lower layer is insufficient.

WO 96/34316 discloses a photosensitive planographic printing plate precursor having a single-layered photosensitive layer composed of a polymer comprising a photo-hardenable group and an acid group or an acid salt group and a photopolymerization initiator. This photosensitive planographic printing plate precursor can also be loaded immediately after exposure into a printing machine so that printing is started without any processing after exposure. This photosensitive planographic printing plate precursor, however, has insufficient durability in printing. Therefore, the durability in printing becomes very poor if the pH value of dampening water in printing is shifted so as to become alkaline.

Further, Japanese Patent Application Laid-Open (JP-A) No. 47-8,657 discloses that a photosensitive planographic printing plate precursor that can be loaded immediately after exposure into a printing machine so that printing is started without any processing after exposure can be obtained by a photosensitive composition comprising polyvinylpyrrolidone, a polymeric polycarboxylic acid, an olefinically unsaturated monomer, a photopolymerization initiator, and the like. However, the use of the photopolymerization initiator disclosed therein presented problems in terms of sensitivity and fogging after exposure.

SUMMARY OF THE INVENTION

Accordingly, an object of the present invention is to provide a photosensitive planographic printing plate precursor which can be loaded immediately into a printing machine so that printing is started without any post-processing after exposure, which exhibits good durability in printing even in low-exposure areas, and which is less liable to fog in the period between exposure and printing.

After intense studies, the present inventors have achieved the present invention based on a discovery that a combination of a specific photosensitive layer and a specific substrate provides a photosensitive planographic printing plate precursor which can be loaded immediately into a printing machine so that printing is started without any processing after exposure and which always exhibits good durability in printing.

That is, the photosensitive planographic printing plate precursor of the present invention comprises an aluminum substrate surface-treated such that the center line surface roughness thereof (Ra) is in a range of from 0.30 $\mu$m or more to 0.55 $\mu$m or less and a photosensitive layer provided on the substrate and comprised of a photosensitive composition containing (a) a water-soluble or water-dispersible polymer, (b) a monomer or oligomer having at least one ethylenically unsaturated double bond capable of photopolymerization, and (c) a photopolymerization initiation system having $\lambda_{max}$ in a range of from 330 nm or more to 375 nm or less such that the light absorbance A at $\lambda_{max}$ and the absorbance B at 400 nm fulfill a relationship of B/A<0.1.

The above-mentioned (c) photopolymerization initiation system maybe a system containing a photopolymerization initiator having $\lambda_{max}$ in a range of from 330 nm or more to 375 nm or less such that the light absorbance A at $\lambda_{max}$ and the absorbance B at 400 nm fulfill the relationship of B/A<0.1, or may be a system containing a photopolymerization initiator and a sensitizer wherein the system as a whole has $\lambda_{max}$ in a range of from 330 nm or more to 375 nm or less such that the light absorbance A at $\lambda_{max}$ and the absorbance B at 400 nm fulfill the relationship of B/A<0.1.

Generally, although the use of a photopolymerization initiation system like the above-mentioned system whose $\lambda_{max}$ is towards shorter wavelengths produces little fogging in the period between exposure and printing, a problem with such a system is that the sensitivity is so reduced that the durability in printing in low-exposure areas is impaired. However, the present inventors found that the use of an aluminum substrate surface-treated such that the center line surface roughness thereof (Ra) is 0.55 $\mu$m or less increases the durability in printing in low-exposure areas and therefore two requirements, i.e., prevention of fogging and durability in printing in low-exposure areas, can be fulfilled at the same time. In a planographic printing plate precursor comprising a substrate and an ordinary photosensitive layer provided thereon, a substrate having a coarser surface is known to provide better durability in printing due to better adhesion between the photosensitive layer and the substrate. In contrast, a photosensitive layer according to the present invention provides better durability in printing if the photosensitive layer is used in a combination with a substrate having a smooth surface. Although not fully elucidated, the mechanism is presumably as follows. In a photosensitive layer which comprises a water-soluble or water-dispersible polymer and a photopolymerization initiation system having $\lambda_{max}$ towards shorter wavelengths, has excellent hydrophilicity, and requires no developing processing, the image areas become thinner and finally the hydrophilic substrate is exposed after a large number of prints are produced. In this case, if the surface of the substrate is smooth, the substrate is unlikely to be exposed and therefore an image omission due to exposure of the hydrophilic substrate hardly occurs even after a required large number of prints are produced, thus providing excellent durability in printing.

DETAILED DESCRIPTION OF THE PREFERRED EMBODIMENTS

Details of the present invention are given below.

In the present invention, (a) a water-soluble or water-dispersible polymer (hereinafter referred to as water-soluble/water-dispersible polymer on occasion) is not particularly limited. Examples of the polymer include water-soluble polymers such as polyethylene glycol, polyvinyl alcohol, polyvinylpyrrolidone, polyacrylic acid, water-soluble nylon, water-soluble urethane, a polymer containing sulfonic acid or a sulfonic acid salt, a water-soluble cellulosic derivative, gum arabic, gelatin, and derivatives thereof.

From the standpoint of durability in printing, these water-soluble/water-dispersible polymers preferably have in the structures thereof a functional group contributing to photopolymerization. Examples of such polymers include a water-soluble/water-dispersible polymer produced by a polymer reaction between polyvinyl alcohol and glycidyl methacrylate so that the polymer obtained has a functional group capable of photopolymerization, a water-soluble/water-dispersible polymer produced by copolymerization between vinylpyrrolidone and allyl methacrylate so that the polymer obtained has a water-soluble skeleton and a photo-crosslinkable skeleton, and an ammonium salt of a polymer obtained by copolymerization between methacrylic acid and allyl methacrylate. Examples of the functional group (hereinafter referred to as a photopolymerizable functional group on occasion), which can be introduced into the structures of these water-soluble/water-dispersible polymers and which can contribute to photopolymerization, include a methacrylate group, an acrylate group, an allyl group, and the like. These functional groups may be introduced by a polymer reaction or by a copolymerization of monomers having these functional groups carried out so that these functional groups are introduced into the polymer skeleton of the water-soluble/water-dispersible polymers. The amount of these photopolymerizable functional groups contained in the polymers is preferably of 0.7 to 4.0 m eq./g. If the content is less than 0.7 m eq./g, durability in printing cannot be improved and the effect of the addition is not observed, whereas a content of more than 4.0 m eq./g impairs develop ability in a printing machine. A particularly preferred contained amount is of from 1.2 to 3.0 m eq./g.

In order to impart water-solubility or water-dispersibility to a polymer, it is necessary to introduce an ionic hydrophilic group or a nonionic hydrophilic group into the polymer. Among these groups, a nonionic hydrophilic group is preferable from the standpoint of the elimination of dependence on pH of dampening water in printing.

Among the above-mentioned polymers, particularly preferable are polyvinylpyrrolidone, a derivative thereof and the polymers containing sulfonic acid or a sulfonic acid salt, which are described below in detail. The use of such polymers reduces the dependence on pH of dampening water and diminishes the loss of paper at the start of printing.

Examples of the salt in the polymer containing sulfonic acid or a sulfonic acid salt (hereinafter referred to as a polymer containing a sulfonic acid (salt) group on occasion) include an alkali metal salt, an amine salt, a quaternary ammonium salt, and the like. Moreover, it is preferable that these polymers also have a photopolymerizable functional group such as a methacrylate group, an acrylate group, an allyl group, and the like. A preferred amount of the sulfonic acid (salt) group contained in the polymers is of 0.50 to 4.0 m eq./g. If the contained amount is less than 0.50 m eq./g, smudging of prints is liable to occur, whereas a contained amount of more than 4.0 m eq./g impairs durability in printing. A particularly preferred contained amount is of from 0.07 to 2.50 m eq./g. A preferred amount of the photopolymerizable functional group contained in the polymers is 0 to 6.00 m eq./g. If the contained amount is more than 6.00 m eq./g, smudging in prints is liable to occur. A particularly preferred contained amount is from 0.5 to 3.4 m eq./g. The weight average molecular weight of the polymer containing a sulfonic acid (salt) group is preferably in a range of from 2,000 to 1,000,000 and is more preferably in the range of from 10,000 to 200,000.

More specifically, a preferred example of the polymer is a polymer having a skeleton containing an acrylic based polymerizable group represented by the following general formula (1) or (2) and a skeleton containing a sulfonic acid (salt) group represented by the following general formula (3) or (4).

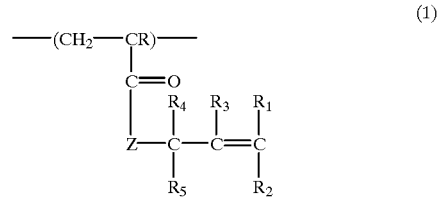

(1)

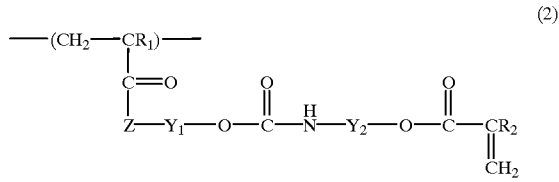

(2)

In the general formula (1), R represents a hydrogen atom or a methyl group; $R_1$, $R_2$, $R_3$, $R_4$, and $R_5$ each represent a group selected from the group consisting of a hydrogen atom, a halogen atom, a carboxyl group, a sulfo group, a nitro group, a cyano group, an amido group, an amino group, an alkyl group, an aryl group, an alkoxy group, an aryloxy group, an alkylamino group, an arylamino group, an alkylsulfonyl group, and an arylsulfonyl group; and Z represents oxygen, sulfur, —NH—, or —NR'— (where R' represents an alkyl group). In the general formula (2), $R_1$ and $R_2$ are the same as R in the general formula (1); Z is the same as Z in the general formula (1); and $Y_1$ and $Y_2$ each represent an alkylene group or an arylene group.

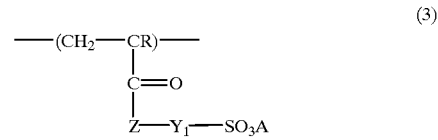

(3)

-continued

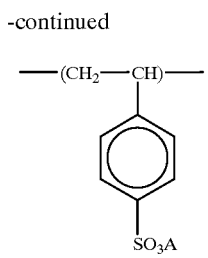

(4)

In the general formulae (3) and (4), A represents a hydrogen atom, sodium, or $NX_4$ where each X represents independently a hydrogen atom or an alkyl group; and $Y_1$ and Z are the same as those in the general formulae (1) and (2).

The polymers containing a sulfonic acid (salt) group may contain by copolymerization, in addition to the above-mentioned components from polymerization, other monomers, such as an alkyl (meth)acrylate, benzyl (meth) acrylate, 2-hydroxyethyl (meth)acrylate, acrylonitrile, or the like, as a third component.

The amount added of the polymer in the whole photosensitive composition is preferably 20 to 80% by weight and more preferably 30 to 70% by weight. If the amount added is less than 20% by weight, smudging in printing occurs, whereas durability in printing is liable to become inferior if the amount added is more than 80% by weight. Neither is preferable. The water-soluble/water-dispersible polymers may be used singly or in a combination of two or more.

In order to improve the durability in printing, an additional polymer, i.e., a water-insoluble polymer or a polymer, which by itself cannot be dispersed in water, maybe used together with the water-soluble/water-dispersible polymer. From the standpoint of further enhancing the film strength, it is preferable that the additional polymer has a polar group. Preferred examples of the polar group having such a property and to be introduced into the polymer include a carboxyl group, a phenolic OH group, a sulfonic acid group, a sulfonamide group, a phosphoric acid group, and salts of these functional groups. Other preferred examples include a hydroxyl group, a cyano group, an amido group, an ester group, an ether group, and others. In some cases, these may be polymers having a polymerizable group introduced therein.

Examples of particularly preferred polymers are copolymers comprised essentially of acrylic acid, methacrylic acid, crotonic acid, or maleic acid. Examples of these polymers include: a multi-component copolymer described in Japanese Patent Application Publication (JP-B) No. 52-7,364 and composed of 2-hydroxyethyl acrylate or 2-hydroxyethyl methacrylate, acrylonitrile or methacrylonitrile, acrylic acid or methacrylic acid, and optionally other copolymerizable monomers; a multi-component copolymer described in JP-A No. 53-120,903 and composed of acrylic acid or methacrylic acid esterified with a hydroxy-terminated group containing a dicarboxylate residue, acrylic acid or methacrylic acid, and optionally other copolymerizable monomers; a multi-component copolymer described in JP-B No. 57-43,890 and composed of a monomer terminated with an aromatic hydroxy group (e.g., N-(4-hydroxyphenyl)methacrylamide), acrylic acid or methacrylic acid, and optionally other copolymerizable monomers; a multi-component copolymer described in JP-A No. 56-4,144 and composed of an alkyl acrylate, acrylonitrile or methacrylonitrile, and an unsaturated carboxylic acid; and modified polyvinyl acetal resins described in JP-A Nos. 61-267,042, 61-128,123, and 62-58, 242.

Also useful are polyurethane resins having a substituent group bearing an acidic hydrogen atom and described in JP-A Nos. 62-123,452, 62-123,453, 63-113,450, 63-261, 350, 63-287,946, 63-287,947, 1-134,354, 2-146,042, 2-77, 748, and others. When these resins are used in combination with the compounds of the present invention, a remarkable improvement in storage stability is observed. Therefore, these resins are most desirable as polymeric binder resins to be combined with the compounds of the present invention.

The substituent group bearing an acidic hydrogen atom means a group whose dissociation constant (pKa) in water is 7 or below. Examples of the group include —COOH, —$SO_2$NHCOO—, —$CONHSO_2$—, —$CONHSO_2$NH—, —$NHCONHSO_2$—, and the like. Among these groups, —COOH is particularly preferable.

Further, acidic polyvinyl alcohol derivatives and acidic cellulose derivatives are also useful. Also useful is a polyvinyl acetal that is rendered alkali-soluble, described in U.K. Patent No. 1,370,316.

If desired, a photopolymerizable group may be introduced into a main or side chain of these polymers. The photopolymerizable groups that can be introduced are as described above and examples of the groups include a methacrylate group, an acrylate group, and an allyl group.

The amount added of these water-insoluble polymers needs to be 60% by weight or less in the whole photosensitive composition. If the amount added is more than 60% by weight, smudging in printing occurs. More preferably, the amount added is 50% by weight or less. These polymers may be used singly or in a combination of two or more. In the case where poly pyrrolidone or a derivative thereof is used as a water-soluble polymer, the use of the polymer having a polar group in combination therewith is particularly preferable, because durability in printing is enhanced due to a synergistic effect of the combination.

The photosensitive composition for use in the planographic printing plate precursor of the present invention needs to contain (b) a monomer or oligomer having at least one ethylenically unsaturated double bond capable of photopolymerization. Here, "oligomer" means a compound having a molecular weight of 5,000 or less.

Some illustrative nonlimiting examples of the monomer or oligomer include: monofunctional acrylate or methacrylate such as polyethylene glycol mono (meth) acrylate (hereinafter acrylate or methacrylate is described as (meth) acrylate), propylene glycol mono (meth) acrylate, phenoxyethyl (meth)acrylate, and the like; polyfunctional acrylate or methacrylate such as polyethylene glycol di(meth)acrylate, trimethylolethane (meth)acrylate, neopentyl glycol di(meth) acrylate, pentaerythritol tri(meth)acrylate, pentaerythritol tetra(meth)acrylate, dipentaerythritol hexa(meth)acrylate, hexanediol di(meth)acrylate, trimethylolpropane tri (acryloloxypropyl) ether, tri(acryloyloxyethyl) isocyanurate, calcium (meth)acrylate, barium (meth)acrylate, compounds which are produced by adding ethylene oxide or propylene oxide to a polyhydric alcohol such as glycerin or trimethylolethane and esterifying the addition product with (meth) acrylic acid; urethane acrylates as described in JP-B No. 48-41,708, JP-B No. 50-6,034, and JP-A No. 51-37,193; polyester acrylates as described in JP-A No. 48-64,183, JP-B No. 49-43,191, and JP-B No. 52-30,490; and an epoxy acrylate produced by reacting an epoxy resin with (meth) acrylic acid; and N-methylolacrylamide described in U.S. Pat. No. 4,540,649. Also usable are compounds introduced as photo-curable monomers and oligomers in Journal of the Adhesives Society of Japan Vol. 20, No.7, pp. 300~308.

The amount added of the polyfunctional monomer in the whole photosensitive composition is preferably from 10 to 70% by weight and most preferably from 15 to 60% by weight. If the amount added is more than 70% by weight, the photosensitive layer becomes undesirably tacky, whereas the sensitivity is reduced if the amount added is less than 10% by weight.

It is essential for the photosensitive composition for use in the photosensitive planographic printing plate precursor of the present invention to contain (c) a photopolymerization initiation system having $\lambda_{max}$ in a range of from 330 nm or more to 375 nm or less such that the light absorbance A at $\lambda_{max}$ and the absorbance B at 400 nm fulfill a relationship of B/A<0.1. This photopolymerization initiation system may be a system containing a photopolymerization initiator having $\lambda_{max}$ in the range of from 330 nm or more to 375 nm or less such that the light absorbance A at $\lambda_{max}$ and the absorbance B at 400 nm fulfill the relationship of B/A<0.1, or may be a system containing a photopolymerization initiator and a sensitizer wherein the system as a whole has $\lambda_{max}$ in the range of from 330 nm or more to 375 nm or less such that the light absorbance A at $\lambda_{max}$ and the absorbance B at 400 nm fulfill the relationship of B/A<0.1. That is to say, the photopolymerization initiation system as a whole in the composition needs to exhibit $\lambda_{max}$ falling in the range of from 330 nm or more to 375 nm or less such that the light absorbance A at $\lambda_{max}$ and the absorbance B at 400 nm fulfill the relationship of B/A<0.1. If B/A is greater than 0.1, fogging occurs when the planographic printing plate precursor is placed under a white light lamp in the period between exposure and printing and thus causes smudging in printing. If $\lambda_{max}$ is on a shorter-wavelength side of 330 nm, image formation is impossible because sensitivity is extremely reduced.

In the photopolymerization system, particularly preferred is a system whose $\lambda_{max}$ in light absorption is in a range of from 350 nm or more to 370 nm or less.

The photopolymerization initiation system is not particularly limited so long as the system fulfills the above-mentioned conditions. A particularly preferred photopolymerization initiation system is a combination of a photopolymerization initiator or a sensitizer having a triazine or oxadiazole skeleton, and an onium salt. If an onium salt is used as the photopolymerization initiator, the aforementioned $\lambda_{max}$ wavelength and B/A are determined by a mixing ratio of the onium salt and the sensitizer.

In the present invention, the absorption measurement can be performed by measuring the ultraviolet absorption of a solution containing 10 mg of a corresponding compound dissolved in one liter of 1-methoxy-2-propanol, using an ultraviolet spectrometer. In the case where the sensitizer is added, the sensitizer in an amount corresponding to 10 mg of the photopolymerization initiator, the amount being based on the weight ratio between the photopolymerization initiator and the sensitizer, is dissolved for the measurement.

A particularly preferred photopolymerization initiator having a triazine or oxadiazole skeleton is a compound having the structure represented by any one of the following general formulae (I) to (III).

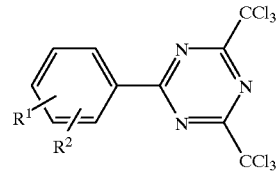
(I)

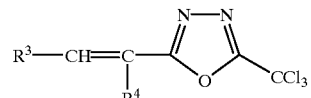
(II)

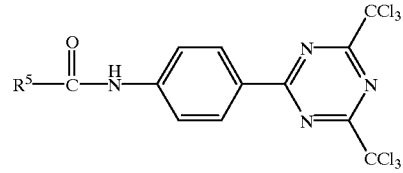
(III)

In these formulae, $R^1$ and $R^2$ each represent a hydrogen atom, a hydroxyl group, or an alkoxy group. If one of $R^1$ and $R^2$ is a hydrogen atom, the other substituent group needs to be a hydroxyl group or an alkoxy group. If the other substituent group is an alkoxy group, $R^1$ and $R^2$ may be linked to each other.

$R^3$ represents a phenyl group, a naphthyl group, or a heterocyclic skeleton, which may have a substituent group. Examples of the substituent group include an alkoxy group, a hydroxyl group, a styryl group, and an alkoxystyryl group. Examples of $R^4$ include a hydrogen atom, an alkyl group, and a phenyl group.

$R^5$ represents a phenyl group, which may have a substituent group. Examples of the substituent group include a hydroxy group and an alkoxy group.

Some illustrative nonlimiting examples of compounds having a triazine or oxadiazole skeleton and suited as photopolymerization initiators are listed in Table 1 together with physical properties of the compounds.

TABLE 1

| | Photopolymerization initiator | $\lambda_{max}$ | B/A |
|---|---|---|---|
| No. 1 | CH₃-C(CH₃)(CH₃)-O-⌬-CH=CH-[oxadiazole]-CCl₃ | 334 nm | 0 |
| No. 2 | HO-⌬-C(=O)-N(H)-⌬-[triazine](CCl₃)(CCl₃) | 357 nm | 0.031 |

TABLE 1-continued

| | Photopolymerization initiator | $\lambda_{max}$ | B/A |
|---|---|---|---|
| No. 3 | 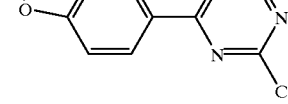 | 357 nm | 0.077 |
| No. 4 | 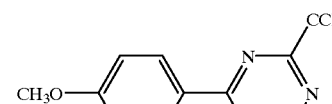 | 333 nm | 0 |
| No. 5 | 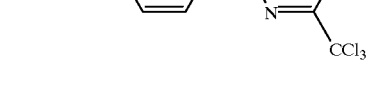 | 338 nm | 0 |
| No. 6 | 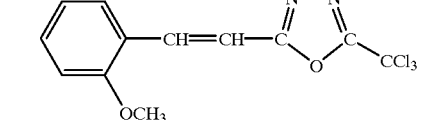 | 346 nm | 0.015 |
| No. 7 |  | 338 nm | 0 |
| No. 8 |  | 334 nm | 0 |
| No. 9 | 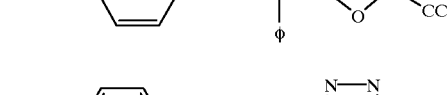 | 341 nm | 0 |

Specific examples of onium salts as other preferred photopolymerization initiators are diaryl iodonium salts and triaryl sulfonium salts. Specific examples of sensitizers to be used in combination with these onium salts are 9,10-dimethoxy anthraquinone and 9,10-diphenyl anthracene. It must be noted, however, that the present invention is not limited by these examples.

The photosensitive composition of the present invention may further contain a dye. The purpose of using the dye is to obtain a visible image by exposure (exposure-visualized image) and a visible image after developing.

A dye suited for this purpose is one whose color changes by a reaction with a free radical or an acid. The term "color changes" includes a change from colorless to colored, a change from colored to colorless, and a change from one color to a different color.

Examples of the dye in which a change from colored to colorless or a change from one color to a different color takes place include triphenylmethane-based dyes, diphenylmethane-based dyes, oxazine-based dyes, xanthene-based dyes, iminonaphthoquinone-based dyes, azomethine-based dyes, and anthraquinone-based dyes, which are represented by Victoria Pure Blue BOH (trade name, manufactured by Hodogaya Chemical Co., Ltd.) and a naphthalenesulfonic acid salt thereof, Oil Blue No. 603 (trade name, manufactured by Orient Chemical Industries Co., Ltd.), Patent Pure Blue (trade name, manufactured by Sumitomo Mikuni Chemical Co., Ltd.), Crystal Violet, Brilliant Green, Ethyl Violet, Methyl Violet, Methyl Green, Erythrosine B, Basic Fuchsine, Malachite Green, Oil Red, m-Cresol Purple, Rhodamine B, auramine, 4-p-diphenylaminophenyliminonaphthoquinone, cyano-p-diethylaminophenylacetanilide, and others.

On the other hand, examples of the dye in which a change from colorless to colored takes place include leuco dyes and primary or secondary arylamine-based dyes represented by, for example, triphenylamine, diphenylamine, o-chloroaniline, 1,2,3-triphenylguanidine, naphthylamine, diaminodiphenylmethane, p,p'-bis-dimethylaminodiphenylamine, 1,2-dianilinoethylene, p,p',p"-tris-dimethylaminotriphenylmethane, p,p'-bis-dimethylaminodiphenylmethylimine, p,p',p"-triamino-o-methyltriphenylmethane, p,p'-bis-dimethylaminodiphenyl-4-anilinonaphthylmethane, and p,p',p"-triaminotriphenylmethane.

From the standpoint of ease in examining a printing plate, a leuco dye which changes from colorless to colored is preferable for use in the present invention, a leuco triphenylmethane-based dye is more preferable, and Leuco Crystal Violet is particularly preferable.

Ordinarily, the amount of the dye contained in the photosensitive composition is preferably about 0.5 to about 10% by weight, more preferably about 1 to 5% by weight, based on the total solids of the whole composition.

Examples of a surfactant that can be used for improving the coatability of the photosensitive composition of the present invention include a fluorine-containing surfactant and a nonionic surfactant. Particularly preferred are fluorine-containing surfactants (e.g., Megafac F-171, 173, 177 and Defenser MCF 300, 312, 313 [trade names, all manufactured by Dainippon Ink and Chemicals Inc.] and Modiper F-100, 102, 110 [trade names, all manufactured by Nippon Oil & Fats Co., Ltd.]) as described in JP-A Nos. 62-170,950 and 62-226,143 and U.S. Pat. No. 3,787,351.

Further, it is preferable to incorporate an inhibitor of thermal polymerization into the photosensitive composition. Useful as the inhibitor are, for example, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and 2-mercaptobenzoimidazole.

Examples of a wax include behenic acid, behenic acid amide, and carboxylic acids having a long-chain alkyl group such as stearic acid, and esters and amides thereof.

Examples of a plasticizer, which is used to impart flexibility and abrasion resistance to the film of the photosensitive layer, include dibutyl phthalate, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and an oligomer or polymer of acrylic acid or methacrylic acid. Among these plasticizers, tricresyl phosphate is particularly preferable.

Preferred examples of an acidic compound having a low molecular weight, which is used to prevent smudging, include phosphoric acid, phosphorous acid, pyrophosphoric acid, phenylsulfonic acid, oxalic acid, boric acid, p-toluenesulfonic acid, benzenesulfonic acid, p-hydroxybenzenesulfonic acid, 2-methoxy-4-hydroxy-5-benzoylbenzenesulfonic acid, 3-sulfophthalic acid, 4-sulfophthalic acid, 2-sulfoterephthalic acid, 5-sulfoisophthalic acid, isopropylnaphthalenesulfonic acid, t-butylnaphthalenesulfonic acid, malicacid, tartaric acid, dipicolinic acid, tricarbazolic acid, polyacrylic acid and copolymers thereof, polyvinylphosphonic acid and copolymers thereof, polyvinylsulfonic acid and copolymers thereof, 5-nitronaphthalene-1-phosphonic acid, 4-chlorophenoxymethylphosphonic acid, sodium phenylmethyl-pyrazolonephosphonate, citric acid, 2-phosphonobutane-1,2,4-tricarboxylicacid, 1-phosphonoethane-1,2,2-tricarboxylic acid, and 1-hydroxyethane-1,1-disulfonic acid.

Preferred examples of a development accelerator include a higher alcohol, an acid anhydride, and an anionic surfactant.

In addition, preferably used are, for example, lipophilicity-sensitizers to enhance the lipophilic sensitivity of image portions, which are described in JP-A No. 55-527, exemplified by a styrene/maleic anhydride copolymer half-esterified with alcohol, a novolac resin such as a p-t-butylphenol/formaldehyde resin, and a fatty acid-ester of p-hydroxystyrene. Although the amounts of these additives vary depending on the compositions in which these additives are used and the purpose of addition, the amounts are generally 0.01 to 30% by weight based on the whole solids of the composition.

The photosensitive composition stated above is applied to an aluminum substrate surface-treated such that the center line surface roughness thereof (Ra) is in a range of from 0.30 $\mu$m or more to 0.55 $\mu$m or less, and the coating is then dried, thus forming a photosensitive layer. In this way, a photosensitive planographic printing plate precursor of the present invention is prepared.

From the standpoint of increasing the dimensional accuracy in printing, the substrate for use in the present invention needs to be an aluminum substrate. The aluminum substrate for use in the present invention includes an aluminum alloy substrate.

The aluminum substrate is preferably of IS material. The surface of the aluminum substrate is preferably surface treated in order to enhance water retention and to increase the adhesion to the photosensitive layer.

Examples of the surface-roughening method are generally known methods such as brushing, ball-abrasion, electrolytic etching, chemical etching, liquid-honing, sand-blasting, and combinations thereof. Among these methods, brushing, electrolytic etching, chemical etching, and liquid-honing are preferable, and a surface-roughening method including the use of electrolytic etching is particularly preferable.

Further, as described in JP-A No. 54-63,902, a method comprising brushing followed by electrolytic etching is also preferable.

As for an electrolytic bath for use in the electrolytic etching, an aqueous solution containing acid, alkali, or a salt thereof or alternatively an aqueous solution containing an organic solvent is used. Among these solutions, particularly preferable is an electrolytic solution containing hydrochloric acid, nitric acid, or a salt thereof. The aluminum plate, after being surface-roughened, is subjected, if necessary, to a desmutting treatment using an aqueous solution of an acid or alkali. The aluminum plate thus obtained is desirably subjected to an anodizing treatment which is most preferably performed in a bath containing sulfuric acid or phosphoric acid.

If necessary, the aluminum plate is further subjected to an additional treatment. Particularly preferred examples of such additional treatment include: a treatment with a silicate (sodium silicate, potassium silicate) described in U.S. Pat. Nos. 2,714,066 and 3,181,461; a treatment with a potassium fluorozirconate described in U.S. Pat. No. 2,946,638; a treatment with phosphomolybdate described in U.S. Pat. No. 3,201,247; a treatment with an alkyl titanate described in U.K. Patent No. 1,108,559; a treatment with a polyacrylic acid described in German Patent No. 1,091,433; a treatment with a polyvinylphosphonic acid described in German Patent No. 1,134,093 and U.K. Patent No. 1,230,447; a treatment with a phosphonic acid described in JP-B No. 44-6,409; a treatment with aphytic acid described in U.S. Pat. No. 3,307,951; a treatment with a salt produced from a hydrophilic organic polymer and divalent metal described in JP-A Nos. 58-16,893 and 58-18,291; a hydrophilicity imparting treatment by providing a subbing layer of a water-soluble polymer having a sulfonic acid group described in JP-A No. 59-101,651; and a coloration treatment with an acid dye described in JP-A No. 60-64,352. Examples of other hydrophilicity imparting treatments include, for example, a silicate electrodeposition described in U.S. Pat. No. 3,658,662.

In addition, also preferable is a sealing treatment after graining and anodizing of an aluminum plate. The sealing treatment is performed by, for example, immersing the aluminum plate in hot water or in a hot aqueous solution containing a salt of an inorganic or organic acid, or by using a steam bath.

Further details of the substrate for use in the present invention are given below. Firstly, an IS aluminum plate, which contains iron at a weight percentage of 0.1 to 0.5%, silicon at a weight percentage of 0.03 to 0.3%, copper at a weight percentage of 0.003 to 0.3%, and titanium at a weight percentage of 0.01 to 0.1%, is etched by immersion in an aqueous alkali solution, which is preferably a 1 to 30% aqueous solution of sodium hydroxide, potassium hydroxide, sodium carbonate, sodium silicate or the like, at 20 to 80° C. for 5 to 250 seconds. The etching bath may contain aluminum in an amount corresponding to about ⅕ of the alkali.

Next, neutralization after alkali etching and removal of smut are performed by immersing the aluminum plate in a 10 to 30% aqueous solution of nitric acid or sulfuric acid, at 20 to 70° C. for 5 to 250 seconds.

The surface of the aluminum plate is then cleaned and is subjected to a surface-roughening treatment of the following procedure. A preferred surface-roughening treatment is brushing or/and electrolytic etching.

The temperature of the electrolytic solution is normally 10 to 60° C. The a.c. current for use in the electrolysis may be rectangular, trapezoidal, or sinusoidal so long as the positive and negative polarities are alternately exchanged. The electricity may be a commercially available single-phase or three-phase current. The current density for the treatment is preferably of 5 to 100 A/dm$^2$ for the treatment period of 10 to 300 seconds.

The center line surface roughness (Ra) of the aluminum alloy substrate surface in the present invention is adjusted by the brush diameter for brushing or the quantity of electricity in the electrolytic etching so that the center line surface roughness (Ra) falls in a range of from 0.30 $\mu$m to 0.55 $\mu$m and preferably in a range of from 0.35 $\mu$m to 0.50 $\mu$m. If the center line surface roughness (Ra) of the surface is less than 0.30 $\mu$m, water allowance becomes narrower and the glare of the plate surface worsens to an extent that it is difficult to see the plate surface when printing is performed, whereas durability in printing becomes worse if the center line surface roughness (Ra) of the surface is more than 0.55 $\mu$m.

After being grained as stated above, it is preferable to remove the smut from the aluminum alloy plate by using a 10 to 50% hot sulfuric acid solution (40 to 60° C.) or a dilute aqueous solution of alkali (e.g., sodium hydroxide). If a solution of alkali is used, the plate is subsequently immersed in a solution of an acid (nitric acid or sulfuric acid) to clean and neutralize the surface.

After the removal of the surface smut, the plate is subjected to an anodizing treatment. The anodizing may be performed by a traditionally known method. A sulfuric acid solution is the most useful electrolytic solution. Next to the sulfuric acid, phosphoric acid is also useful as the electrolytic solution. In addition, a mixture of sulfuric acid and phosphoric acid, as described in JP-A No. 55-28,400, is also useful.

Although anodizing by a sulfuric acid process is normally performed by using a d.c. current, an a.c. current may also be used. The concentration of the sulfuric acid is 5 to 30%, and the electrolysis is performed at 20 to 60° C. for 5 to 250 seconds to thereby form an oxide film of 1 to 10 g/m$^2$ on the surface. Preferably, the electrolytic solution contains aluminum ions. The current density is preferably of 1 to 20 A/dm$^2$. If a phosphoric acid process is employed, the concentration of the phosphoric acid is of 5 to 50%, and the electrolysis is performed at 30 to 60° C. for 10 to 300 seconds at a current density of 1 to 15 A/dm$^2$.

After being treated as stated above, the aluminum substrate is preferably subjected to a surface treatment using a silicate as described in U.S. Pat. No. 2,714,066.

In addition, it is also preferable to apply a subbing layer to the substrate as described in JP-A No. 59-101,651.

The above-described photosensitive composition is provided on the substrate according to the following procedure. Firstly, a coating liquid of a photosensitive composition is prepared by dissolving prescribed amounts of a photosensitive diazo resin, a polymeric binder of the present invention, a fluorine-containing surfactant of the present invention, and optionally, additives are dissolved in an appropriate solvent (such as methyl cellosolve, ethyl cellosolve, dimethoxyethane, diethylene glycol monomethyl ether, diethylene glycol dimethyl ether, 1-methoxy-2-propanol, methylcellosolve acetate, acetone, methyl ethyl ketone, methanol, dimethylformamide, dimethylacetamide, cyclohexanone, dioxane, tetrahydrofuran, methyl lactate, ethyl lactate, ethylene dichloride, dimethyl sulfoxide, water, or the like). Next, the coating liquid is applied to the substrate, and the coating is then dried. Although the solvents may be used singly, it is preferable to use a mixture of a high-boiling solvent, such as methyl cellosolve, 1-methoxy-2-propanol, methyl lactate, or the like, and a low-boiling solvent such as methanol, methyl ethyl ketone, or the like.

The concentration of the solids in the coating liquid of the photosensitive composition is preferably in a range of from 1 to 50% by weight. The weight of the photosensitive composition coated is about preferably of from 0.2 to 10 g/m$^2$ (dry weight) and more preferably of from 0.5 to 3 g/m$^2$.

It is preferable to form a mat layer, which is comprised of protrusions formed independently from one another, on the photosensitive layer.

The purpose of the mat layer is to improve vacuum adhesion between a negative image film and a photosensitive planographic printing plate precursor in a contact exposure process, thus shortening the vacuum-drawing time, and to prevent minute halftone dots from being destroyed by insufficient adhesion at the time of exposure.

Examples of the methods for forming the mat layer include a method wherein a surface is powdered with a powder of a solid material and the powder is then thermally fused, as described in JP-A No. 55-12,947; and a method wherein a surface is sprayed with water containing a polymer and the surface is then dried, as described in JP-A No. 58-182,636. Although any of such methods may be employed in the present invention, it is preferable that the mat layer itself be soluble in or removable by dampening water or ink.

The photosensitive layer, which is coated and formed on the substrate, is given a negative relief image either by exposure through a transparent original having, for example, line images or halftone dot images, or by image-wise exposure using a laser or the like.

Examples of light sources suited for the exposure include, for example, a carbon arc lamp, a mercury lamp, a xenon lamp, a metal halide lamp, a strobe, ultraviolet light, and laser light.

After being exposed as stated above, the photosensitive planographic printing plate precursor of the present invention is immediately loaded into a printing machine and printing can be started without the employment of post-processing such as developing processing.

Printing may be performed with any type of printing machine. Examples of the printing methods include (1) a method wherein dampening water is applied to a printing plate and thereafter ink is applied to the plate to start printing; (2) a method wherein ink is applied to a printing plate and thereafter dampening water is applied to the plate to start printing; (3) a method wherein dampening water and ink are applied at the same time to a printing plate to start printing; and (4) a method wherein the non-image portion is wiped with water or a cleaner and thereafter printing is started by any of (1), (2) and (3) methods. According to the present invention, prints free of remnant non-image portions are obtained and durability in printing is good.

EXAMPLES

In order that those skilled in the art will be better able to practice the present invention, the following examples are given by way of illustration and not by way of limitation.

Examples 1 to 6

A 0.24 mm thick rolled plate of aluminum, containing aluminum at a weight percentage of 99.5%, copper at a weight percentage of 0.01%, titanium at a weight percentage of 0.03%, iron at a weight percentage of 0.3%, and silicon at a weight percentage of 0.1%, was grained by using a 20% by weight aqueous suspension of 400-mesh pumice stone powder (manufactured by Kyoritsu Yogyo Co., Ltd.) and a rotating nylon (6–10 nylon) brush having a brush (hair) diameter of 0.30 mm, and the surface was then washed well with water.

The aluminum plate was etched by immersion in a 15% by weight sodium hydroxide aqueous solution (containing 5% by weight of aluminum) so that the amount of dissolved aluminum was 5 g/m$^2$, and the aluminum plate was then washed with flowing water. After that, the aluminum plate was neutralized with a 1% by weight nitric acid aqueous solution, and was thereafter subjected to an electrolytic surface-roughening treatment in a 0.7% by weight nitric acid aqueous solution (containing 0.5% by weight of aluminum as ions) by using a rectangular alternating wave voltage (current ratio r=0.90, a current wave shape described in examples of JP-B No. 58-5,796) at a cathode voltage of 9.3 volts, an anode voltage of 10.5 volts and by a quantity of electricity at anode of 160 coulombs g/m$^2$. After being washed with water, the aluminum plate was etched by immersion in a 10% by weight sodium hydroxide aqueous solution at 40° C. so that the amount of dissolved aluminum was 1 g/m$^2$, and the aluminum plate was then washed with water. Next, a desmutting treatment of the aluminum plate was performed by immersion in a 30% by weight sulfuric acid aqueous solution at 50° C., and the aluminum plate was then washed with water.

Next, the aluminum plate was treated to produce a porous anodized film on the surface in a 20% by weight sulfuric acid aqueous solution (containing 0.8% by weight of aluminum as ions) by using a d.c. current. That is, by carrying out an electrolysis at a current density of 13 A/dm$^2$ and by adjusting the electrolysis time, a substrate having an anodized film of 2.0 g/m$^2$ was prepared. The substrate was then washed with water.

The surface of the aluminum substrate obtained in the above procedure was measured by using a Macbeth RD920 reflection densitometer. The reflection density was 0.28 and the center line surface roughness (Ra) of the surface was 0.45 µm. The center line surface roughness (Ra) was measured by using a SURFCOM contact needle meter manufactured by Tokyo Seimitsu Kikai Co., Ltd. (contact needle : 10 µm R).

A subbing solution 1 of the following composition was applied to the aluminum plate thus obtained, and the coating was dried at 80° C. for 30 seconds. The weight of the dried coating was 2 mg/m$^2$.

| Subbing solution 1 | in grams |
| --- | --- |
| Sodium salt of a methyl methacrylate/ethyl acrylate/sodium 2-acrylamide-2-methylpropanesulfonic acid copolymer (60/25/15 in molar ratio of the copolymer) | 0.02 |
| Methanol | 100 |

Next, a photosensitive solution 1 (containing a photopolymerization initiator according to the type and amount as shown in Table 2) having the following composition was applied by using a bar coater. The coating was dried at 120° C. for 30 seconds. The weight of the dried coating was 1.5 mg/m$^2$. Photosensitive solution 1 in parts by weight Polyvinylpyrrolidone 0.6 Aronix M-305 (polymerizable acrylate monomer having many functional groups; trade name, manufactured by Toa Gosei Co., Ltd.) 0.4 Photopolymerization initiator (as shown in Table 2)

| | |
| --- | --- |
| Behenic acid | 0.004 |
| Fluorine-containing surfactant F-176 PF (20% methyl isobutyl ketone solution, trade name, manufactured by Dainippon Ink and Chemicals Inc.) | 0.01 |
| Leuco Crystal Violet | 0.04 |
| 1-methoxy-2-propanol | 25 |

The photosensitive layer was subjected to a matting treatment comprising electrostatically spraying the photosensitive layer with a spray solution of the following composition and then drying the coating in an atmosphere of 80° C. for 5 seconds.

| Spray solution | in grams |
| --- | --- |
| Sodium salt of a methyl methacrylate/ethyl acrylate/sodium 2-acrylamide-2-methylpropanesulfonic acid copolymer (60/25/15 in molar ratio of the copolymer) | 0.5 |
| Tartrazine | 0.01 |
| Water | 100 |

TABLE 2

| | Photopolymerization initiator | Amount added |
| --- | --- | --- |
| Example 1 | (CH$_3$)$_3$C—O—C$_6$H$_4$—CH=CH—(oxadiazole)—CCl$_3$ | 0.1 parts by weight |

TABLE 2-continued

| | Photopolymerization initiator | Amount added |
|---|---|---|
| Example 2 | HO—C6H4—C(=O)—NH—C6H4—triazine(CCl3)2 | 0.1 parts by weight |
| Example 3 | methylenedioxyphenyl—triazine(CCl3)2 | 0.1 parts by weight |
| Example 4 | CH3O—C6H4—triazine(CCl3)2 | 0.1 parts by weight |
| Example 5 | (2-OCH3)C6H4—CH=CH—oxadiazole-CCl3 | 0.1 parts by weight |
| Example 6 | Ph2I+ PF6− / 9,10-diphenylanthracene | 0.1 parts by weight/ 0.1 parts by weight |

The heights and widths of the constituent mats were of 2 to 6 μm and of 20 to 150 μm, respectively, and the total numbers of the mats was 100 units/m². The coating weight was 0.1 g/m².

These photosensitive planographic printing plate precursors were exposed image-wise at a distance of 1 m from a lamp, using a PS Light manufactured by Fuji Film Co., Ltd. for 1 minute. Then, the plates were each loaded into an SOR printing machine manufactured by Hidelberg Co., Ltd. In this way, printing was started, and examination was conducted by counting the number of complete prints obtainable (durability in printing).

In addition, the plates, after being exposed to the PS Light, were left to stand under a white light lamp of 500 Lux for 4 hours, and thereafter were each loaded into the SOR printing machine manufactured by Hidelberg Co., Ltd. In this way, printing was started, and examination was conducted to assess the degree of freedom from smudging in prints.

The results are shown in Table 3.

TABLE 3

| | Number of sheets that could be printed | Freedom from smudging in prints by using plates after being placed under a white light lamp |
|---|---|---|
| Example 1 | 50,000 sheets | good |
| Example 2 | 80,000 sheets | good |
| Example 3 | 70,000 sheets | good |
| Example 4 | 40,000 sheets | good |
| Example 5 | 40,000 sheets | good |
| Example 6 | 40,000 sheets | good |
| Comparative Example 1 | 5,000 sheets | good |
| Comparative Example 2 | 40,000 sheets | poor |
| Comparative Example 3 | 50,000 sheets | poor |

Comparative Examples 1 to 3

Aluminum plates were surface-treated and coated with the subbing solution as in Example 1. The substrates thus obtained were each coated with the photosensitive solution as in Examples 1 to 6, except that the photopolymerization initiator and the amount added thereof in the photosensitive solution were changed. The coating weight was 1.5 mg/M². The types of the photopolymerization initiators and the amounts added thereof are shown in Table 4. Then, as in Examples 1 to 6, mats were provided on each of the photosensitive layers and the planographic printing plate precursors thus prepared were tested in the same way. The results are shown in Table 3.

TABLE 4

| | Photopolymerization initiator | Amount added |
|---|---|---|
| Comparative example 1 | 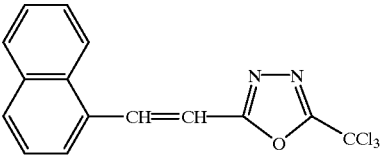 λ max 325 nm B/A 0 | 0.1 parts by weight |
| Comparative example 2 | 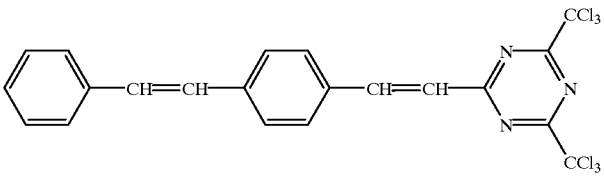 λ max 363 nm B/A 0.26 | 0.1 parts by weight |
| Comparative example 3 | 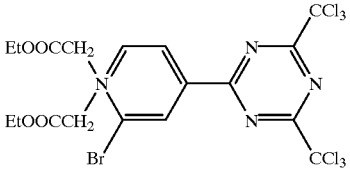 λ max 376 nm B/A 0.50 | 0.1 parts by weight |

Comparative Examples 4 to 12

Aluminum plates were surface-treated and coated with the subbing layer as in Example 1, except that the nylon brush had a brush (hair) diameter of 0.48 mm and the center line surface roughness (Ra) of the aluminum plates after brushing was 0.64 μm. The substrates thus obtained were coated with the photosensitive solutions of Examples 1 to 6 and of Comparative Examples 1 to 3, respectively. The coating weight was 1.5 mg/m².

The planographic printing plate precursors thus prepared were tested in the same way.

The results are shown in Table 5.

TABLE 5

| | Number of sheets that could be printed | Freedom from smudging in prints by using plates after being placed under a white light lamp |
|---|---|---|
| Comparative Example 4 | 1,000 sheets or less | good |
| Comparative Example 5 | 5,000 sheets | good |
| Comparative Example 6 | 5,000 sheets | good |
| Comparative Example 7 | 1,000 sheets | good |
| Comparative Example 8 | 1,000 sheets | good |
| Comparative Example 9 | 1,000 sheets | good |
| Comparative Example 10 | 1,000 sheets | good |
| Comparative Example 11 | 10,000 sheets | poor |
| Comparative Example 12 | 10,000 sheets | poor |

As stated above, the photosensitive planographic printing plate precursors of the present invention, comprising a photopolymerization initiation system having $\lambda_{max}$ in a range of from 330 nm to 375 nm such that the light absorbance A at $\lambda_{max}$ and the absorbance B at 400 nm fulfill a relationship of B/A<0.1 and the aluminum substrate surface-treated such that the center line surface roughness thereof (Ra) is 0.45 μm, exhibit excellent durability in printing and hardly produce smudges in prints. By contrast, all of the photosensitive planographic printing plate precursors of Comparative Examples 1 to 3, comprising the photosensitive composition outside the scope of the present invention, and of the photosensitive planographic printing plate precursors of Comparative Examples 4 to 12, comprising the aluminum substrate having a larger center line surface roughness (Ra), exhibit inferior performances in terms of smudges in prints or durability in printing.

Examples 7 to 16

Aluminum plates were surface-treated as in Examples 1 to 6. The substrates thus obtained were each coated with the following photosensitive solution 2 (containing a water-soluble/water-dispersible polymer in an amount as shown in Tables 6 to 8). Then, as in Examples 1 to 6, mats were provided on each of the photosensitive layers. In this way, planographic printing plate precursors were prepared.

| Photosensitive solution 2 | in parts by weight |
|---|---|
| Water-soluble/water-dispersible polymer (as in Tables 6 to 8) | |
| Pentaerythritol tetraacrylate | 0.4 |
| Photopolymerization initiator represented by the following formula | 0.01 |
| Behenic acid | 0.004 |
| Leuco Crystal Violet | 0.04 |

-continued

| Photosensitive solution 2 | in parts by weight |
|---|---|
| Water-soluble/water-dispersible polymer (as in Tables 6 to 8) | 5 |
| 1-methoxy-2-propanol | 25 |
| Water | 2 |

[Structure: HO-C6H4-C(=O)-NH-C6H4-triazine with two CCl3 groups]

TABLE 6

| | Polymer | Amount added |
|---|---|---|
| Example 7 | Polyvinylpyrrolidone | 0.6 parts by weight |
| Example 8 | Polyvinylpyrrolidone | 0.5 parts by weight |
| | Copolymer: -(CH$_2$C(CH$_3$)(C(=O)OC$_2$H$_4$OH))- 18 mol %, -(CH$_2$CH(CN))- 50 mol %, -(CH$_2$C(CH$_3$)(C(=O)OCH$_2$-C$_6$H$_5$))- 24 mol %, -(CH$_2$C(CH$_3$)(COOH))- 8 mol % | 0.1 parts by weight |
| Example 9 | Polyvinylpyrrolidone | 0.5 parts by weight |
| | Copolymer: -(CH$_2$C(CH$_3$)(C(=O)OCH$_2$CH=CH$_2$))- 80 mol %, -(CH$_2$C(CH$_3$)(COOH))- 20 mol % | 0.1 parts by weight |
| Example 10 | Polyvinylpyrrolidone | 0.5 parts by weight |
| | Copolymer: -(CH$_2$C(CH$_3$)(C(=O)OCH$_2$CH=CH$_2$))- 80 mol %, -(CH$_2$C(CH$_3$)(COO$^-$ $^+$N(CH$_3$)$_4$))- 20 mol % | 0.1 parts by weight |

TABLE 7

| | Polymer | Amount added |
|---|---|---|
| Example 11 | Polyvinylpyrrolidone | 0.5 parts by weight |
| | Copolymer: -(CH$_2$C(CH$_3$)(C(=O)OC$_2$H$_4$OH))- 18 mol %, -(CH$_2$CH(CN))- 50 mol %, -(CH$_2$C(CH$_3$)(C(=O)OCH$_2$-C$_6$H$_5$))- 24 mol %, -(CH$_2$C(CH$_3$)(COO$^-$ $^+$N(CH$_3$)$_4$))- 8 mol % | 0.1 parts by weight |

TABLE 7-continued

| Polymer | Amount added |
|---|---|
| Example 12: Polyvinylpyrrolidone; copolymer of [−(CH$_2$C(CH$_3$))−]$_{30\text{ mol}\%}$ with C=O, OC$_2$H$_4$OCNHC$_2$H$_4$OC(=O)−C(=CH$_2$)CH$_3$ and [−(CH$_2$C(CH$_3$))−]$_{70\text{ mol}\%}$ with COO$^{\ominus}$ $^{\oplus}$N(CH$_3$)$_4$ | 0.4 parts by weight / 0.2 parts by weight |
| Example 13: copolymer of [−(CH$_2$C(CH$_3$))−]$_{80\text{ mol}\%}$ with C=O, OCH$_2$CH=CH$_2$ and [−(CH$_2$C(CH$_3$))−]$_{20\text{ mol}\%}$ with COO$^{\ominus}$ $^{\oplus}$N(CH$_3$)$_4$ | 0.6 parts by weight |

TABLE 8

| Polymer | Amount added |
|---|---|
| Example 14: copolymer of [−(CH$_2$C(CH$_3$))−]$_{20\text{ mol}\%}$ with C=O, OC$_2$H$_4$OCNHC$_2$H$_4$OC(=O)−C(=CH$_2$)CH$_3$ and [−(CH$_2$C(CH$_3$))−]$_{80\text{ mol}\%}$ with COO$^{\ominus}$ $^{\oplus}$N(CH$_3$)$_4$ | 0.6 parts by weight |
| Example 15: [−(CH$_2$CH)−]$_{80\text{ mol}\%}$ with OH and [−(CH$_2$CH)−]$_{20\text{ mol}\%}$ with OCNHC$_2$H$_4$OC(=O)−C(=CH$_2$)CH$_3$ | 0.6 parts by weight |
| Example 16: [−(CH$_2$CH)−]$_{80\text{ mol}\%}$ with N-pyrrolidone and [−(CH$_2$CH)−]$_{20\text{ mol}\%}$ with OCNHC$_2$H$_4$OC(=O)−C(=CH$_2$)CH$_3$ | 0.6 parts by weight |

These photosensitive planographic printing plate precursors were exposed image-wise at a distance of 1 m from a lamp by using a PS Light manufactured by Fuji Film Co., Ltd. for 1 minute. Then, the plates were each loaded into an SOR printing machine manufactured by Hidelberg Co., Ltd. In this way, printing was started, and examination was conducted by counting the number of complete prints obtainable (durability in printing) using alkaline dampening water.

In addition, the plates, after being exposed to the PS Light, were left to stand under a white light lamp of 500 Lux for 4 hours, and thereafter were each loaded into the SOR printing machine SOR manufactured by Hidelberg Co., Ltd. In this way, printing was started, and examination was conducted to assess the degree of freedom from smudging in prints. The results are shown in Table 9.

TABLE 9

|  | Number of sheets that could be printed | Freedom from smudging in prints by using plates after being placed under a white light lamp |
|---|---|---|
| Example 7 | 70,000 sheets | good |
| Example 8 | 100,000 sheets | good |
| Example 9 | 100,000 sheets | good |
| Example 10 | 90,000 sheets | good |
| Example 11 | 90,000 sheets | good |
| Example 12 | 90,000 sheets | good |
| Example 13 | 90,000 sheets | good |
| Example 14 | 80,000 sheets | good |
| Example 15 | 120,000 sheets | good |
| Example 16 | 120,000 sheets | good |

As is apparent from Table 9, all of the photosensitive planographic printing plate precursors of the present invention do not produce smudges in prints in printing after being placed under the white light lamp and exhibit excellent durability in printing.

Comparative Examples 13 and 14

For the purpose of comparison with the present invention, aluminum plates were surface-treated as in Examples 1 to 6 and as in Comparative Examples 4 to 12, respectively. The substrates thus obtained were each coated with the following photosensitive solution 3 (at a coating weight of 1.5 mg/m$^2$). In this way, planographic printing plate precursors, which required developing processing with an alkali solution, were prepared.

| Photosensitive solution 3 | in parts by weight |
|---|---|
| Polymer represented by the following formula | 1.0 |
| Pentaerythritol tetraacrylate | 0.3 |
| Photopolymerization initiator represented by the following formula | 0.1 |
| Leuco crystal Violet | 0.03 |
| Behenic acidamide | 0.005 |
| 1-methoxy-2-propanol | 25 |
| Water | 1 |

Polymer

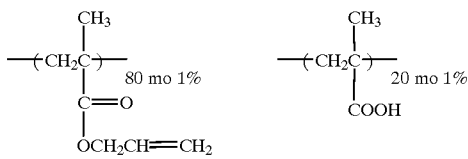

Photopolymerization initiator

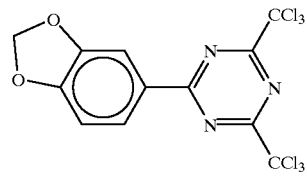

These photosensitive planographic printing plate precursors were exposed image-wise at a distance of 1 m from a lamp by using a PS Light manufactured by Fuji Film Co., Ltd. for 1 minute. After the exposure, the plates were developed by using a developer solution prepared by diluting developer agent DC-3C (trade name, manufactured by Fuji Film Co., Ltd.) with the same amount of water and were thereafter subjected to gum treatment. Then, the plates were each loaded into an SOR printing machine manufactured by Hidelberg Co., Ltd. In this way, printing was started, and examination was conducted by counting the number of complete prints obtainable. The results are shown in Table 10.

TABLE 10

| | Brush diameter used for surface-treating aluminum substrate | Center line surface roughness of substrate (Ra) | Number of sheets that could be printed |
|---|---|---|---|
| Comparative Example 13 | 0.30 mm | 0.45 μm | 100,000 sheets |
| Comparative Example 14 | 0.48 mm | 0.64 μm | 150,000 sheets |

As is apparent from Table 10, known planographic printing plate precursors requiring developing processing with an alkali solution exhibit better durability in printing if the center line surface roughness of substrate (Ra) is larger.

Next, examples, wherein a polymer containing a sulfonic acid (salt) group is used as (a) the water-soluble or water-dispersible polymer, are given below. Synthesis of polymer containing sulfonic acid (salt) group

Synthesis Example 1

70.0 g of methyl methacrylate, 15.0 g of ethyl acrylate, 31.0 g of 2-acrylamide-2-methylpropanesulfonic acid, 290 g of isopropanol as a solvent, and 28 g of water were placed in a 1L three-neck flask, and a solution was produced.

Then, while being stirred under a nitrogen stream, the temperature of the solution was raised to 70° C. At this temperature, 2.0 g of V-65 (trade name, manufactured by Wako Pure Chemical Industries, Ltd.) was added to the solution, and a polymerization reaction was effected for 4 hours.

After the reaction, 80 g of a 1N sodium hydroxide aqueous solution was added to the solution and the resulting solution was stirred. By removing the isopropanol and water from the solution under a reduced pressure, 110 g of a water-soluble polymer 1 was obtained (the structure of the polymer is given in Table 11 in the column of Example 17 which is described later)

Synthesis Example 2

400 g of N-t-butylmethacrylamide, 171 g of 2-acrylamide-2-methylpropanesulfonic acid, and 1142 g of N,N-dimethylformamide were placed in a 2L three-neck flask, and a solution was produced. Then, while being stirred under a nitrogen stream, the temperature of the solution was raised to 65° C. At this temperature, 8 g of V-65 (manufactured by Wako Pure Chemical Industries, Ltd.) was added to the solution, and a polymerization reaction was effected for 3 hours.

After the reaction, the solution was added dropwise to 38 L of ethyl acetate to produce a precipitate, which was then collected and dried. In this way, 550 g of a water-soluble polymer 2 was obtained (the structure of the polymer is given in Table 11 in the column of Example 18 which is described later).

Synthesis Example 3

68.4 g of 2-hydroxyethyl methacrylate, 77.6 g of 2-acrylamide-2-methylpropanesulfonic acid, and 440 g of N,N-dimethylacetamide as a solvent were placed in a 2L three-neck flask, and a solution was produced. Then, while being stirred under a nitrogen stream, the temperature of the solution was raised to 65° C. At this temperature, 2 g of V-65 (manufactured by Wako Pure Chemical Industries, Ltd.) was added to the solution, and a polymerization reaction was effected for 4 hours.

Next, 0.1 g of dibutyltin dilaurate was added to the solution and thereafter 93 g of 2-isocyanateethyl methacrylate was added to the solution. The solution was stirred at 100° C. for 5 hours. After the reaction, the solution was cooled and was added dropwise to 10 L of ethyl acetate to produce a precipitate, which was then collected and dried. In this way, 210 g of a water-soluble polymer 3 was obtained (the structure of the polymer is given in Table 12 in the column of Example 22 which is described later).

Examples 17 to 22

A 0.24 mm thick rolled plate of aluminum, containing aluminum at a weight percentage of 99.5%, copper at a weight percentage of 0.01%, titanium at a weight percentage of 0.03%, iron at a weight percentage of 0.3%, and silicon at a weight percentage of 0.1% was grained by using a 20% by weight aqueous suspension of 400-mesh pumice stone powder (trade name, manufactured by Kyoritsu Yogyo Co., Ltd.) and a rotating nylon (6-10 nylon) brush having a brush (hair) diameter of 0.30 mm, and the surface was then washed well with water.

The aluminum plate was etched by immersion in a 15% by weight sodium hydroxide aqueous solution (containing 5% by weight of aluminum) so that the amount of dissolved aluminum was 5 g/m$^2$, and the aluminum plate was then washed with flowing water. After that, the aluminum plate was neutralized with a 1% by weight nitric acid aqueous solution, and was thereafter subjected to an electrolytic surface-roughening treatment in a 0.7% by weight nitric acid aqueous solution (containing 0.5% by weight of aluminum as ions) by using a rectangular alternating wave voltage (current ratio r=0.90, a current wave shape described in examples of JP-B No. 58-5,796) at a cathode voltage of 9.3 volts and an anode voltage of 10.5 volts and by a quantity of electricity at anode of 160 coulombs g/m$^2$. After being washed with water, the aluminum plate was etched by immersion in a 10% by weight sodium hydroxide aqueous solution at 40° C. so that the amount of dissolved aluminum was 1 g/m$^2$, and the aluminum plate was then washed with water. Next, a desmutting treatment of the aluminum plate was performed by immersion in a 30% by weight sulfuric acid aqueous solution at 50° C., and the aluminum plate was then washed with water.

Next, the aluminum plate was treated to produce a porous anodized film on the surface in a 20% by weight sulfuric acid aqueous solution (containing 0.8% by weight of aluminum as ions) by using a d.c. current. That is, by carrying out an electrolysis at a current density of 13 A/dm$^2$ and by adjusting the electrolysis time, a substrate having an anodized film of 2.0 g/m$^2$ was prepared. The substrate was then washed with water.

The surface of the aluminum substrate obtained in the above procedure was measured by using a Macbeth RD920 reflection densitometer. The reflection density was 0.28 and the center line surface roughness (Ra) of the surface was 0.45 µm. The center line surface roughness (Ra) was measured by using a SURFCOM contact needle meter manufactured by Tokyo Seimitsu Kikai Co., Ltd. (contact needle: 10 µm R).

Next, a photosensitive solution 4 having the following composition was applied to the substrate by using a bar coater. The coating was dried at 120° C. for 30 seconds. The weight of the dried coating was 1.2 mg/m$^2$. Photosensitive solution 4 in parts by weight Water-soluble polymer shown in Tables 12 and 13 0.6 Sartomer 399 (trade name, manufactured by SARTOMER Corp.) 0.4

| | |
|---|---|
| Photopolymerization initiator represented by the following formula | 0.1 |
| Fluorine-containing surfactant F-176 PF (20% methyl isobutyl ketone solution, trade name, manufactured by Dainippon Ink and Chemicals Inc.) | 0.01 |
| Phosphoric acid (85% aqueous solution) | 0.02 |
| Leuco Crystal Violet | 0.04 |

The photosensitive layer was subjected to a matting treatment comprising electrostatically spraying the photosensitive layer with a spray solution of the following composition and then drying the coating in an atmosphere of 80° C. for 5 seconds.

Photopolymerization initiator

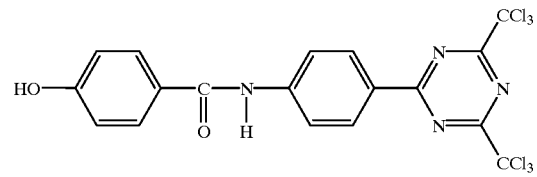

TABLE 11

| | Water-soluble/water-dispersible polymer | Content of sulfonic acid (salt) (meq/g) | Content of polymerizable group (meq/g) | $\overline{M}$ w |
|---|---|---|---|---|
| Example 17 | —(CH$_2$C(CH$_3$))— (C=O, OCH$_3$) 70 mol %   —(CH$_2$CH)— (C=O, OC$_2$H$_5$) 15 mol %   —(CH$_2$CH)— (C=O, HN—C(CH$_3$)$_2$—CH$_2$SO$_3$Na) 15 mol % | 1.10 | 0 | 30000 |

TABLE 11-continued

| | Water-soluble/water-dispersible polymer | Content of sulfonic acid (salt) (meq/g) | Content of polymerizable group (meq/g) | $\overline{M}w$ |
|---|---|---|---|---|
| Example 18 | —(CH₂C)— / C=O / HN—C(CH₃)(CH₃)—CH₃ / 70 mol %  —(CH₂CH)— / C=O / HN—C(CH₃)(CH₃)—CH₂SO₃H / 30 mol % | 1.65 | 0 | 70000 |
| Example 19 | —(CH₂C(CH₃))— / C=O / OCH₂CH=CH₂ / 85 mol %  —(CH₂CH)— / C=O / HN—C(CH₃)(CH₃)—CH₂SO₃⁻N⁺(CH₃)₄ / 15 mol % | 1.00 | 5.70 | 90000 |

TABLE 12

| Example | Water-soluble/water-dispersible polymer | Content of sulfonic acid (salt) (meq/g) | Content of polymerizable group (meq/g) | $\overline{M}w$ |
|---|---|---|---|---|
| Example 20 | —(CH₂C(CH₃))— / C=O / HN—C(CH₃)(CH₃)—CH₃ / 50 mol %  —(CH₂CH)— / C=O / HN—C(CH₃)(CH₃)—CH₂SO₃⁻ / 50 mol %   H—N⁺(CH₃)(CH₃)—C₂H₄OC(=O)—CH=CH₂ | 1.80 | 2.20 | 110000 |
| Example 21 | —(CH₂C(CH₃))— / C=O / HN—CH₂CH=CH₂ / 70 mol %  —(CH₂CH)—C₆H₄—SO₃Na / 30 mol % | 1.80 | 4.70 | 10000 |

TABLE 12-continued

| Example | Water-soluble/water-dispersible polymer | Content of sulfonic acid (salt) (meq/g) | Content of polymerizable group (meq/g) | $\overline{M}w$ |
|---|---|---|---|---|
| Example 22 | 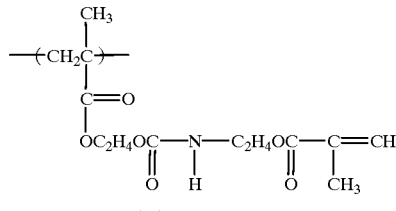 60 mol % / 40 mol % | 1.50 | 2.30 | 150000 |

| Spray solution | in grams |
|---|---|
| Sodium salt of a methyl methacrylate/ethyl acrylate/sodium 2-acrylamide-2-methylpropanesulfoninc acid copolymer (60/25/15 in molar ratio of the copolymer) | 0.5 |
| Tartrazine | 0.01 |
| Water | 100 |

The heights and widths of the constituent mats were of 2 to 6 μm and of 20 to 150 μm, respectively, and the total numbers of the mats was 100 units/m². The coating weight was 0.1 g/m².

These photosensitive planographic printing plate precursors were exposed image-wise at a distance of 1 m from a lamp by using a PS Light manufactured by Fuji Film Co., Ltd. for 1 minute. Then, the plates were each loaded into an SOR printing machine manufactured by Hidelberg Co., Ltd. In this way, printing was started, and examination of develop ability in a printing machine was conducted by counting the number of prints at and after which printing faults were no longer found and the number of complete prints obtainable (durability in printing). The results are shown in Table 13.

TABLE 13

|  | Developability in a printing machine | Durability in printing |
|---|---|---|
| Example 17 | 10th sheet | 90,000 sheets |
| Example 18 | 15th sheet | 100,000 sheets |
| Example 19 | 15th sheet | 130,000 sheets |
| Example 20 | 20th sheet | 120,000 sheets |
| Example 21 | 20th sheet | 100,000 sheets |
| Example 22 | 15th sheet | 120,000 sheets |
| Example 17 | 10th sheet | 90,000 sheets |
| Example 7 | 20th sheet | 70,000 sheets |
| Example 13 | 100th sheet | 90,000 sheets |

As described above, the use of a water-soluble polymer containing sulfonic acid or a sulfonic acid salt makes it possible to provide a better balance between develop ability in a printing machine and durability in printing. For example, in contrast with the case where polyvinylpyrrolidone is used as in Example 7 shown in Table 13 or a water-soluble polymer containing a carboxyl group is used as in Example 12, develop ability in a printing machine in particular is enhanced and the balance between develop ability in a printing machine and durability in printing becomes better if a water-soluble polymer containing sulfonic acid or a sulfonic acid salt is used.

As stated above, the photosensitive planographic printing plate precursors of the present invention could be loaded immediately into a printing machine so that printing was started without any post-processing after exposure, and exhibited good durability in printing even in low-exposure areas. As an additional excellent property, the plates hardly produced fogging even when the plates were left to stand under a white light lamp in the period between exposure and printing.

What is claimed is:

1. A photosensitive planographic printing plate precursor comprising an aluminum substrate surface-treated such that the center line surface roughness thereof (Ra) is in a range of from 0.30 μm or more to 0.55 μm or less and a photosensitive layer provided on the substrate and comprised of a photosensitive composition containing:
   (a) a water-soluble polymer,
   (b) a monomer or oligomer having at least one ethylenically unsaturated double bond capable of photopolymerization, and
   (c) a photopolymerization initiation system having $\lambda_{max}$ in a range of from 330 nm or more to 375 nm or less such that the light absorbance A at $\lambda_{max}$ and the absorbance B at 400 nm fulfill a relationship of B/A<0.1.

2. A photosensitive planographic printing plate precursor according to claim 1, wherein (c) the photopolymerization initiation system is a system containing a photopolymerization initiator having $\lambda_{max}$ in the range of from 330 nm or more to 375 nm or less such that the light absorbance A at $\lambda_{max}$ and the absorbance B at 400 nm fulfill the relationship of B/A<0.1, or a system containing a photopolymerization initiator and a sensitizer wherein the system as a whole has $\lambda_{max}$ in the range of from 330 nm or more to 375 nm or less such that the light absorbance A at $\lambda_{max\ and}$ the absorbance B at 400 nm fulfill the relationship of B/A<0.1.

3. A photosensitive planographic printing plate precursor according to claim 2, wherein (a) the water-soluble polymer has in a structure thereof a functional group contributing to photopolymerization.

4. A photosensitive planographic printing plate precursor according to claim 3, wherein (a) the water-soluble polymer has a nonionic hydrophilic group introduced therein.

5. A photosensitive planographic printing plate precursor according to claim 4 including polyvinylpyrrolidone or a derivative thereof as the nonionic hydrophilic group.

6. A photosensitive planographic printing plate precursor according to claim 4 including a polymer containing sulfonic acid or a sulfonic acid salt as the nonionic hydrophilic group.

7. A photosensitive planographic printing plate precursor according to claim 6, wherein the polymer has
- a skeleton containing an acrylic-based polymerizable group represented by one of the following general formulae (1) and (2), and
- a skeleton containing a sulfonic acid (salt) group represented by one of the following general formulae (3) and (4):

general formula (1)

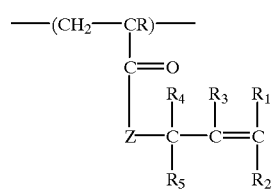

general formula (2)

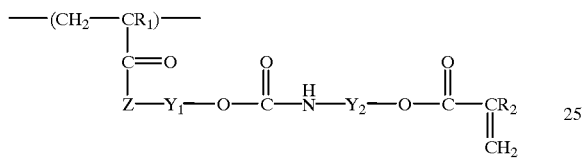

wherein, in the general formula (1), R represents a hydrogen atom or a methyl group; $R_1$, $R_2$, $R_3$, $R_4$, and $R_5$ each represent a group selected from the group consisting of a hydrogen atom, a halogen atom, a carboxyl group, a sulfo group, a nitro group, a cyano group, an amido group, an amino group, an alkyl group, an aryl group, an alkoxy group, an aryloxy group, an alkylamino group, an arylamino group, an alkylsulfonyl group, and an arylsulfonyl group; and Z represents oxygen, sulfur, —NH—, or —NR'— (where R' represents an alkyl group); and wherein, in the general formula (2), $R_1$ and $R_2$ are the same as R in the general formula (1); Z is the same as Z in the general formula (1); and $Y_1$ and $Y_2$ each represent an alkylene group or an arylene group;

general formula (3)

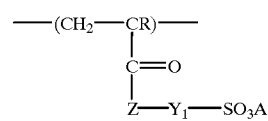

general formula (4)

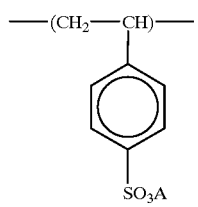

wherein, in the general formulae (3) and (4), A represents a hydrogen atom, sodium, or $NX_4$ where each X represents independently a hydrogen atom or an alkyl group; and $Y_1$ and Z are the same as those in the general formulae (1) and (2).

8. A photosensitive planographic printing plate precursor according to claim 2, wherein (c) the photopolymerization initiation system is a system containing a photopolymerization initiator having a triazine skeleton or an oxadiazole skeleton.

9. A photosensitive planographic printing plate precursor according to claim 2, wherein (c) the photopolymerization initiation system is a photopolymerization initiation system comprising a combination of a sensitizer and an onium salt.

10. A photosensitive planographic printing plate precursor according to claim 8 containing as the photopolymerization initiator having the triazine skeleton or the oxadiazole skeleton a compound having a structure represented by any one of the following general formulae (I) to (III):

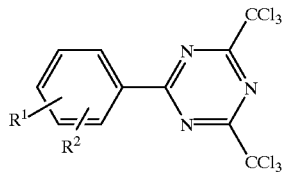

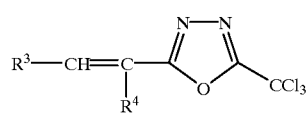

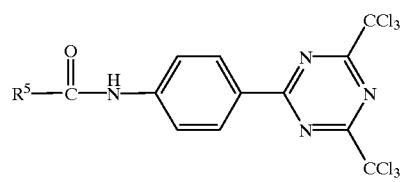

wherein $R^1$ and $R^2$ each represent a hydrogen atom, a hydroxyl group, or an alkoxy group with the proviso that, if one of $R^1$ and $R^2$ is a hydrogen atom, the other substituent group is a hydroxyl group or an alkoxy group, and, if the other substituent group is an alkoxy group, $R^1$ and $R^2$ may be linked to each other; $R^3$ represents a phenyl group, a naphthyl group, or a heterocyclic skeleton, which may have a substituent group exemplified by an alkoxy group, a hydroxyl group, a styryl group, and an alkoxystyryl group; examples of $R^4$ include a hydrogen atom, an alkyl group, and a phenyl group; and $R^5$ represents a phenyl group which may have a substituent group exemplified by a hydroxy group and an alkoxy group.

11. A photosensitive planographic printing plate precursor comprising an aluminum substrate surface-treated such that the center line surface roughness thereof (Ra) is in a range of from 0.30 μm or more to 0.55 μm or less and a photosensitive layer provided on the substrate and comprised of a photosensitive composition containing:
- (a) a water-soluble polymer,
- (b) a monomer or oligomer having at least one ethylenically unsaturated double bond capable of photopolymerization, and
- (c) a photopolymerization initiation system having $\lambda_{max}$ in a range of from 350 nm or more to 370 nm or less such that the light absorbance A at $\lambda_{max}$ and the absorbance B at 400 nm fulfill a relationship of B/A<0.1.

12. A photosensitive planographic printing plate precursor according to claim 11, wherein (c) the photopolymerization initiation system is a system containing a photopolymerization initiator having $\lambda_{max}$ in the range of from 350 nm or more to 370 nm or less such that the light absorbance A at $\lambda_{max}$ and the absorbance B at 400 nm fulfill the relationship of B/A<0.1, or a system containing a photopolymerization initiator and a sensitizer wherein the system as a whole has $\lambda_{max}$ in the range of from 350 nm or more to 370 nm or less such that the light absorbance A at $\lambda_{max}$ and the absorbance B at 400 nm fulfill the relationship of B/A<0.1.

13. A photosensitive planographic printing plate precursor according to claim 12, wherein (a) the water-soluble polymer has in a structure thereof a functional group contributing to photopolymerization.

14. A photosensitive planographic printing plate precursor according to claim 13, wherein (a) the water-soluble polymer has a nonionic hydrophilic group introduced therein.

15. A photosensitive planographic printing plate precursor according to claim 14 including polyvinylpyrrolidone or a derivative thereof as the nonionic hydrophilic group.

16. A photosensitive planographic printing plate precursor according to claim 14 including a polymer containing sulfonic acid or a sulfonic acid salt as the nonionic hydrophilic group.

17. A photosensitive planographic printing plate precursor according to claim 16, wherein the polymer has
  a skeleton containing an acrylic-based polymerizable group represented by one of the following general formulae (1) and (2), and
  a skeleton containing a sulfonic acid (salt) group represented by one of the following general formulae (3) and (4):

general formula (1)

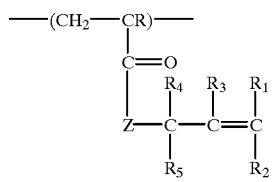

general formula (2)

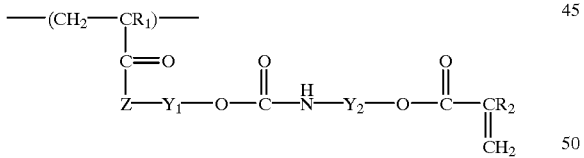

wherein, in the general formula (1), R represents a hydrogen atom or a methyl group; $R_1$, $R_2$, $R_3$, $R_4$, and $R_5$ each represent a group selected from the group consisting of a hydrogen atom, a halogen atom, a carboxyl group, a sulfo group, a nitro group, a cyano group, an amido group, an amino group, an alkyl group, an aryl group, an alkoxy group, an aryloxy group, an alkylamino group, an arylamino group, an alkylsulfonyl group, and an arylsulfonyl group; and Z represents oxygen, sulfur, —NH—, or —NR'— (where R' represents an alkyl group); and wherein, in the general formula (2), $R_1$, and $R_2$ are the same as R in the general formula (1); Z is the same as Z in the general formula (1); and $Y_1$ and $Y_2$ each represent an alkylene group or an arylene group;

general formula (3)

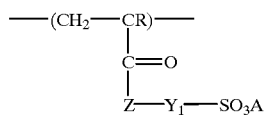

general formula (4)

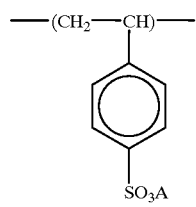

wherein, in the general formulae (3) and (4), A represents a hydrogen atom, sodium, or $NX_4$ where each X represents independently a hydrogen atom or an alkyl group; and $Y_1$ and Z are the same as those in the general formulae (1) and (2).

18. A photosensitive planographic printing plate precursor according to claim 12, wherein (c) the photopolymerization initiation system is a system containing a photopolymerization initiator having a triazine skeleton or an oxadiazole skeleton.

19. A photosensitive planographic printing plate precursor according to claim 12, wherein (c) the photopolymerization initiation system is a photopolymerization initiation system comprising a combination of a sensitizer and an onium salt.

20. A photosensitive planographic printing plate precursor according to claim 18 containing as the photopolymerization initiator having the triazine skeleton or the oxadiazole skeleton a compound having a structure represented by any one of the following general formulae (I) to (III):

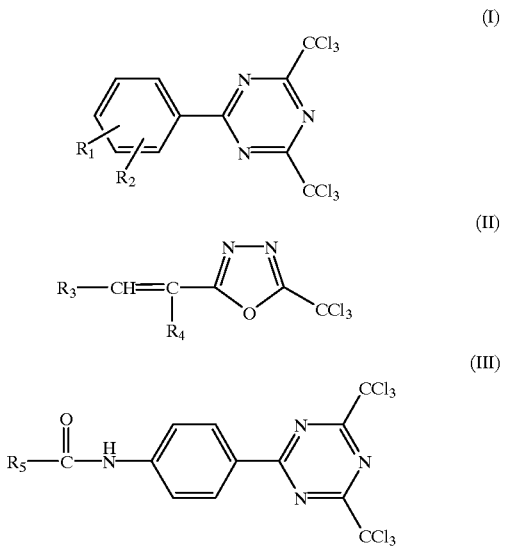

wherein $R^1$ and $R^2$ each represent a hydrogen atom, a hydroxyl group, or an alkoxy group with the proviso that, if one of $R^1$ and $R^2$ is a hydrogen atom, the other substituent group is a hydroxyl group or an alkoxy group, and, if the other substituent group is an alkoxy group, $R^1$ and $R^2$ may be linked to each other; $R^3$ represents a phenyl group, a naphthyl group, or a heterocyclic skeleton, which may have a substituent group exemplified by an alkoxy group, a hydroxyl group, a styryl group, and an alkoxystyryl group; examples of $R^4$ include a hydrogen atom, an alkyl group, and a phenyl group; and $R^5$ represents a phenyl group which may have a substituent group exemplified by a hydroxy group and an alkoxy group.

* * * * *